United States Patent [19]

Morrill, Jr. et al.

[11] 4,338,677

[45] Jul. 6, 1982

[54] MULTI-CLOCK DATA CAPTURE CIRCUIT

[75] Inventors: Justin S. Morrill, Jr., Cascade; John D. Hansen, Colorado Springs, both of Colo.

[73] Assignee: Hewlett-Packard Company, Palo Alto, Calif.

[21] Appl. No.: 160,262

[22] Filed: Jun. 17, 1980

[51] Int. Cl.³ ............................ G06F 3/00; G06F 3/14
[52] U.S. Cl. .................................................... 364/900
[58] Field of Search ... 364/200 MS File, 900 MS File; 235/92 MT

[56] References Cited

U.S. PATENT DOCUMENTS

| 3,460,094 | 8/1960 | Pryor | 364/900 |
|---|---|---|---|
| 3,566,365 | 2/1971 | Rawson et al. | 364/200 |
| 3,629,852 | 12/1971 | Thexton et al. | 364/900 |
| 3,781,824 | 12/1973 | Caiati et al. | 364/900 |
| 4,027,289 | 5/1977 | Toman | 364/900 |
| 4,227,070 | 10/1980 | Baker et al. | 235/92 MT |

*Primary Examiner*—Harvey E. Springborn
*Attorney, Agent, or Firm*—Edward L. Miller

[57] ABSTRACT

A data capture circuit for a logic state analyzer includes a qualifier pattern comparator circuit that responds to a collection of input qualifier signals by producing a number of qualifier pattern signals each representative of the occurrence of a preselectable pattern in the input qualified signals. A like number of clock detection circuits each responds separately to the values of separate clock signals by producing separate qualified clock signals, each of the like number of which represents the simultaneous occurrence of a preselected transition in each particular clock signal and of a qualifier pattern signal associated with that clock signal. The several separate qualified clock signals generally occur at separate times, and each is used to individually capture into several temporary storage registers separate collections of data signal values occurring at those separate times. A master clock selection means allows the user to designate as a master clock signal a qualified clock signal that is expected to occur not earlier in sequence than the others. The master clock signal causes transfer of the contents of the temporary storage registers into intermediate storage registers whose outputs are then merged and combined by subsequent and simultaneous forwarding as a single parallel entity to the main data memory of the logic state analyzer, while at the same time the temporary storage registers are freed to capture fresh data.

5 Claims, 4 Drawing Figures

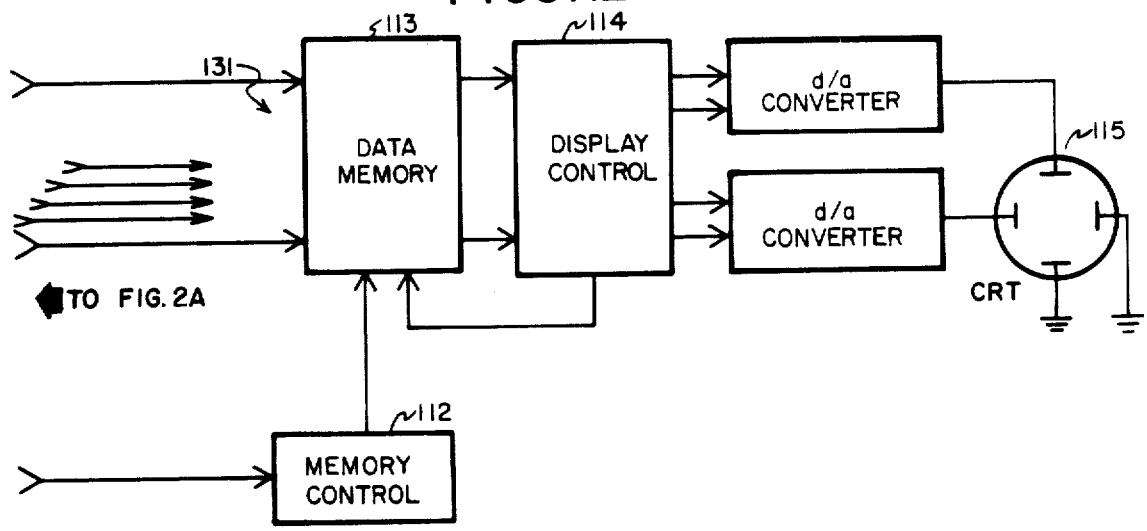
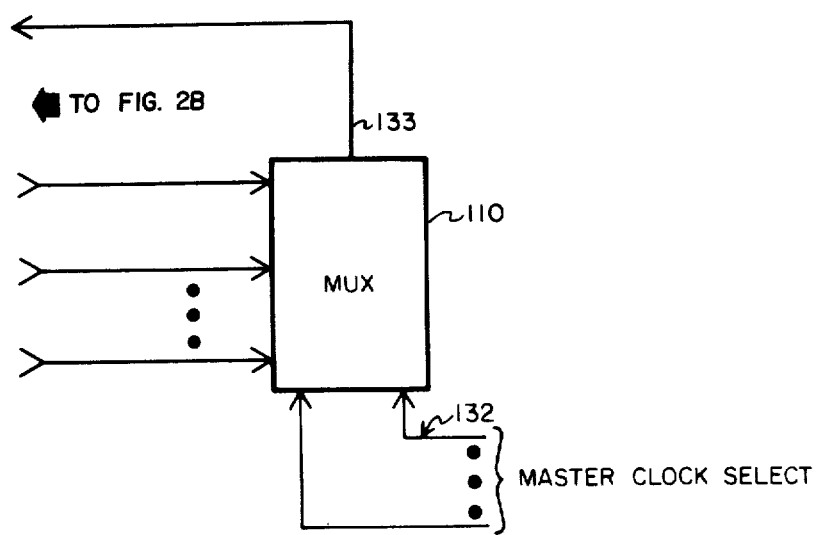

MULTI-CLOCK DATA CAPTURE CIRCUIT

REFERENCE TO AN ISSUED PATENT

This application is related to the subject matter disclosed in U.S. Pat. No. 4,139,903, filed on May 31, 1977, by Justin S. Morrill, Jr., et al and assigned to the Hewlett-Packard Company. U.S. Pat. No. 4,139,903, is hereby incorporated by reference, for the purpose of illustrating one type of logic state analyzer to which the present invention is applicable. In particular, FIG. 10 of U.S. Pat. No. 4,139,903 is a simplified block diagram of a prior art logic state analyzer whose operation is explained in that patent. That FIG. 10 is reproduced in this patent as FIG. 1, and serves as an illustration of the prior art as well as providing a basis for FIGS. 2A–C. FIGS. 2A–C may be considered to be an improvement of FIG. 1 performed in accordance with the principles of the present invention.

BACKGROUND AND SUMMARY OF THE INVENTION

Devices that capture and display sequences of address, data, and status information, etc.,, are known as logic state analyzers. See, for instance, the August 1975, and February 1978, issues of the Hewlett-Packard Journal.

Heretofore, logic state analyzers have not been able to capture collections of data occurring separately in time and subsequently treat the combined collection as a single parallel entity, as if it had actually occurred as a single entity and had been captured all at once. Such a capability would be highly desirable when working with microprocessors incorporating time-multiplexed busses, for example. In such instances the same lines carry electrical signals whose meanings, such as "address", "data" or "status" are dependent upon previous events (i.e., the "state of the system" under test). Often, the "state of the system" is indicated by other signals that may be thought of as "qualifiers" indicating that: an address is present; a memory cycle is a read or a write; an instruction fetch is underway; a DMA memory cycle is in progress; or that an interrupt request is in effect or has been granted. Once the "qualifiers" indicate the "state of the system" it is often the case that a particular clock signal or other signal may be used to strobe data of interest occurring during that particular "state of the system". It is frequently the case that time sequences of such "states of the system" are most conveniently thought of as homogeneous entities. For example, a memory cycle can be conceived of as an address and something either written to or read from that address. No further insight is provided to the logical flow of operations concerning memory by enforcing a time separation between the two for logic state analysis purposes merely because it is expedient to do so in the particular hardware implementation at hand. Indeed, exactly the opposite is true, as such a division amounts to an undesirable overhead operation that consumes extra space in the formatted display and that requires extra user attention to interpret.

According to a preferred embodiment of the invention a logic state analyzer is provided with a multiplicity of clock monitoring circuits whose outputs are then each independently qualified according to the "qualifiers" mentioned above. Each such qualified clock signal representing a selected "state of the system". Separate data capture circuits correspond to each of the qualified clock signals. As each "state of the system" that is of interest occurs the associated data capture circuit captures the relevant data. Such data may occur either at separate times upon the same bus or at the same time at disparate locations. A user selectable qualified combination, or "state of the system", occurring not earlier than any other "state of the system" also of interest is designated as a master transfer signal. That signal causes simultaneous transfer of the current contents of each of the data capture circuits into a single merged parallel representation that is then stored in a memory for subsequent formatted display to the user.

BRIEF DESCRIPTION OF THE DRAWINGS

FIGS. 2A–C constitute a block diagram of a logic state analyzer constructed in accordance with a preferred embodiment of the invention.

DESCRIPTION OF THE PREFERRED EMBODIMENT

Figure 1:
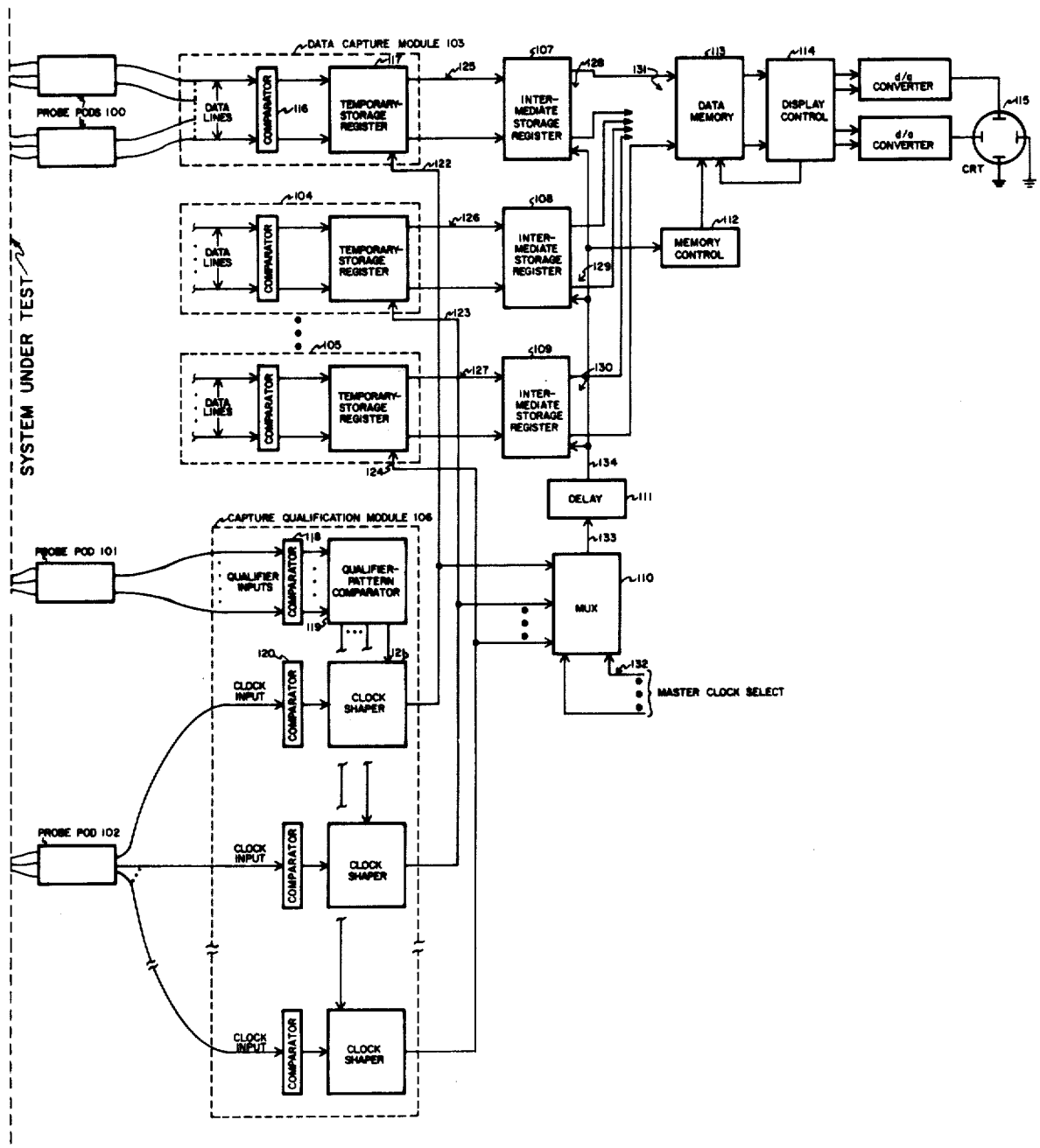
FIG. 1 is a block diagram of a prior art logic state analyzer that is improved upon in accordance with the principles of the invention.

FIG. 1 is a simplified block diagram of a prior art logic state analyzer which is improved in accordance with the principles of the invention. The logic state analyzer of FIG. 1 cannot merge or combine related data captured at separate times into a single entity, but must display such data as distinct events captured separately. For details concerning the use and internal operation of the logic state analyzer of FIG. 1 the reader is referred to U.S. Pat. No. 4,139,903.

Figure 2A:
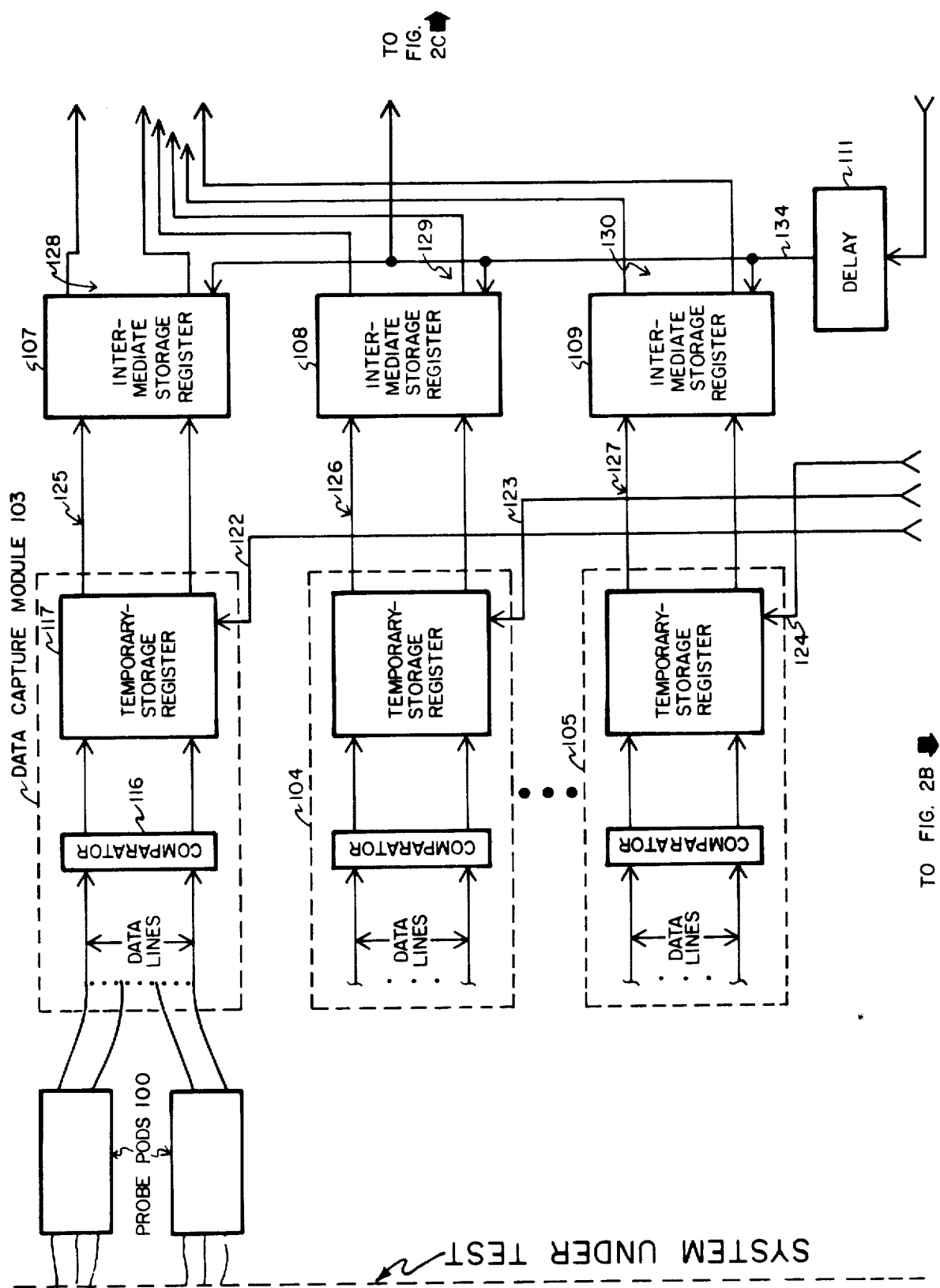
Figure 2B:
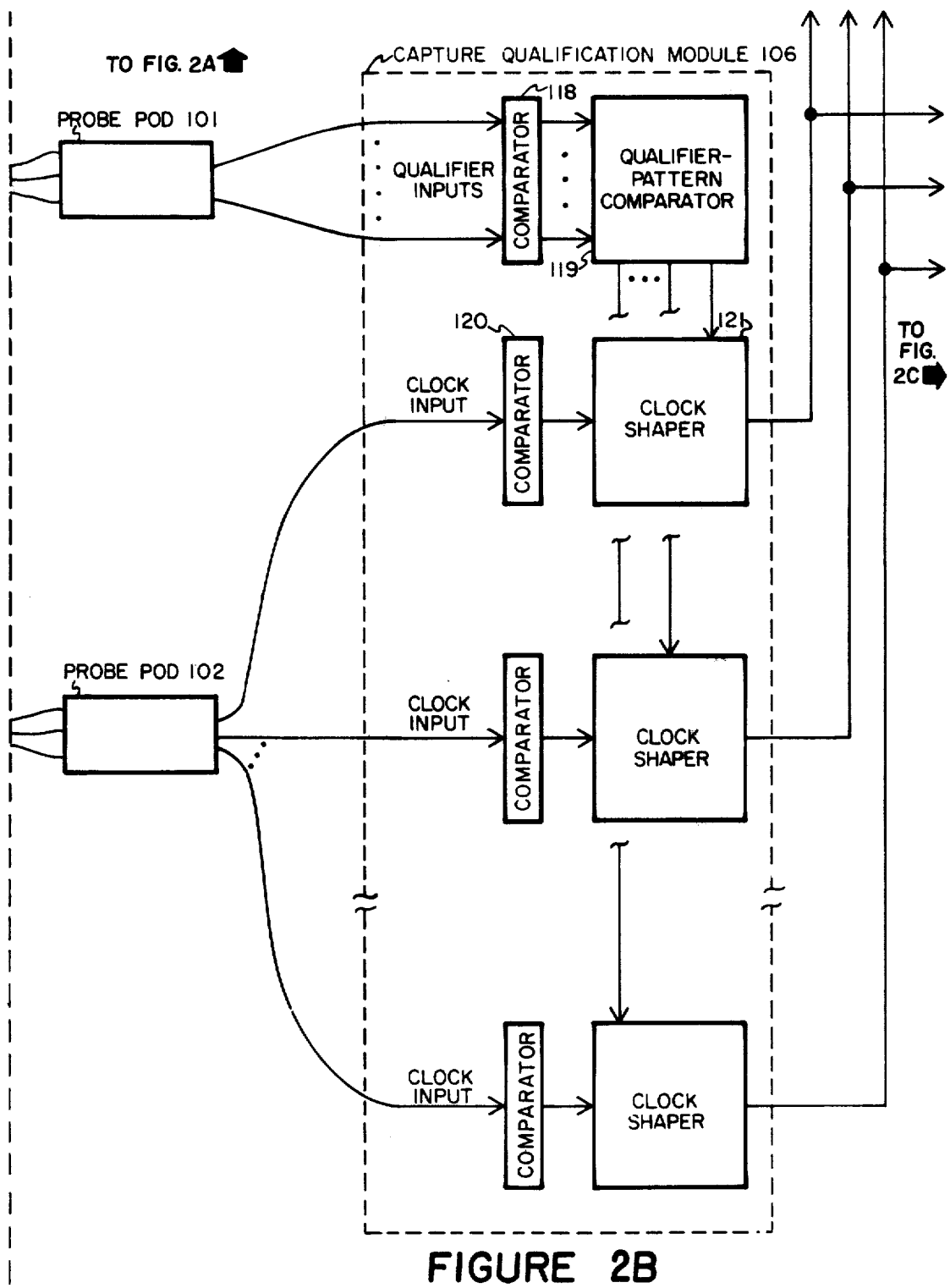

FIGS. 2A–C constitute a block diagram of a logic state analyzer constructed in accordance with a preferred embodiment of the invention. As shown therein, a plurality of data capture modules 103, 104, ..., 105 receive data from the system under test through one or more probes pods 100. Each of the several data capture modules 103, 104, ..., 105 has an associated clock input signal 122, 123, ..., 124. Upon receipt of such a clock input signal a data capture module captures the data from its associated probe pod(s) and makes it available as an intermediate data collection 125, 126, ..., 127. Each such intermediate data collection is coupled to the input of a respective intermediate storage register 107, 108, ..., 109.

Each of the clock input signals 122, 123, ..., 124 is also coupled to a multiplexer 110. The multiplexer 110 responds to master clock selection information 132 to produce a multiplexer output signal 133 which is in turn coupled to a delay circuit 111. The output of the delay circuit 111 is a master data transfer signal 134 which is in turn coupled to each of the respective clock inputs of the several intermediate storage registers 107, 108, ..., 109, as well as coupled to the input of a memory control circuit 112.

The several respective intermediate storage register outputs 128, 129, ..., 130 are combined into a single parallel representation 131 of the captured data. This combined data 131 is stored in a data memory 113 upon receipt of an output signal from the memory control circuit 112. The contents of the data memory 113 are available to a display control circuit 114 that formats the stored captured data and displays it upon a CRT 115.

Each of the data capture modules 103, 104, ..., 105 includes a comparator, of which comparator 116 in data capture module 103 is representative. The outputs of these comparators represent the data under test, as monitored by the probe pod(s) 100. The outputs from each of the several comparators are respectively coupled to their associated temporary storage registers, of which temporary storage register 117 in data capture module 103 is representative. Each of the several temporary storage registers operates in respective response to the several clock input signals 122, 123, ..., 124.

Included in the capture qualification module 106 are a plurality of clock input circuits, of which a comparator 120 and a clock shaper circuit 121 are representative. Each comparator of the several clock input circuits responds to a particular output signal from a probe pod 102 connected to the system clocks, or other suitable signals, of the system under test. The output of each such comparator is coupled to an associated clock shaper circuit. The respective clock shaper circuit outputs 122, 123, ..., 124 are the clock input signals. The several clock input signals 122, 123, ..., 124 are respectively produced when both a respective enable signal is present and the associated comparator provides its individual clock shaper circuit with an input. The various respective enable signals are outputs from a qualifier pattern comparator 119.

The capture qualification module 106 also includes a comparator 118 responsive to a probe pod 101 that is connected to monitor qualifier signals in the system under test. The output signals from the comparator 118 are coupled to the qualifier pattern comparator 119, which is preferably a random access memory (RAM). The output signals from the comparator 119 are the address applied to the RAM, and a previously stored value then read from that address represents for each of the clock input signals the decision of the qualifier comparison activity. That is, the value stored at that address indicates whether or not the qualifier pattern producing that address is a qualifier pattern of interest for its associated clock input signal.

The operation of the circuit of FIG. 1 is as follows. The user connects some number of probe pods, of which probe pods 100, 101 and 102 are representative, to the system under test. The probe pods provide a high impedance electrical connection as well as signal conditioning. The number of data lines monitored by each of the probe pods is a matter of convenience.

In a preferred embodiment each signal monitored by a probe pod results in a differential signal pair, which is in turn coupled to an associated comparator. The comparators provide additional signal conditioning for each differential signal pair and also recombine each differential pair back into a single signal.

The several collections of signals representing the data monitored by those probe pods associated with the several data capture modules 103, 104, ..., 105 are each separately captured in their respective temporary storage registers. Each collection is captured upon receipt of the particular one of the several clock input signals 122, 123, ..., 124 that is respectively associated with the several data capture modules 103, 104, ..., 105. The several data capture modules are thus capable of independently capturing separate collections of data at different times, provided that the capture qualification module 106 exhibits a corresponding capability to separately and independently generate the several clock input signals 122, 123, ..., 124.

The capture qualification module 106 does posses that corresponding capability since each of the several clock input signals 122, 123, ..., 124 is separately and independently generated according to the occurrence of user selected clocks, strobes, etc., in the system under test. Further flexibility is provided by the qualifier pattern comparator 119. It allows the user to define which occurrances and which edges, etc., of such clocks and strobes are of interest in capturing the data. When there is an occurrence of such clocks and strobes that are of interest the individual clock shaper circuits, in response to the nature of their respective enabling inputs from the qualifier pattern comparator, produce signals 122, 123, ..., 124 in one of four modes. The four modes are: pulse for the leading edge of the signal from the associated comparator; pulse for the trailing edge of the signal from the associated comparator; pulse for each of the leading and trailing edges of the signal from the associated comparator; and, no pulse.

The several clock input signals 122, 123, ..., 124 will occur either simultaneously or in some sequence, depending upon the conditions that they represent. The user identifies one of those conditions and its associated clock input signal as occurring not earlier than each of the others. The master clock select information 132 is adjusted by the user to represent the clock input signal so identified. In turn, the multiplexer 110 produces an output signal 133 only when that particular clock input signal occurs. That output signal is delayed by the delay circuit 111 to produce signal 134 to allow proper transfer of the captured data from the several data capture modules to the several intermediate storage registers and also to the data memory 113. During the transfer of the data from the several intermediate storage registers to the data memory 113 the several independently captured collections of data 125, 126, ..., 127 are combined into a single parallel representation 131. The collections of data used to create the parallel representation 131 are the final collections 125, 126, ..., 127 captured by the data capture modules. Prior to the occurrence of the master transfer signal from the delay circuit 111 the several individual data capture modules may contain transitory collections of intermediate data. From the data memory 113 the parallel representation 131 is made available to the rest of the logic state analyzer.

The master clock select information 132 is determined by user actuation of various external controls of the logic state analyzer. In a preferred embodiment those controls take the form of a keyboard (not shown). A controlling circuit (also not shown) responds to sequences of keys pressed on the keyboard and produces the corresponding master clock select information 132. Additional controlling circuitry (also not shown) responding to the keyboard loads the RAM within the qualifier pattern comparator 119 with appropriate values representing the desired type of clock signal qualification.

As an example of the utility of the circuit of FIGS. 2A-C, consider a memory bus upon which addresses followed by their associated data occur separately in time upon the same lines. By arranging for one clock input signal to represent the presence of address information upon the bus the associated data capture module will capture the address. By arranging for another clock input signal to represent the presence of data upon the bus another data capture module will capture the data. By also designating the clock input signal representing the data as the source of the master data transfer signal 134 the combined address and data will be stored in the data memory 113 as a complete parallel-formatted entity.

We claim:

1. A data capture circuit for a logic state analyzer comprising:

first and second data signal conditioning means for respective connection to first and second collections of data signals to condition those signals according to preselected thresholds and for respectively producing first and second collections of conditioned data signals indicative of the logical values of the signals within the first and second collections of data signals;

qualifier signal conditioning means for connection to a collection of qualifier signals to condition those signals according to preselected thresholds and for producing a collection of conditioned qualifier signals indicative of the logical value of the signals within the collection of qualifier signals;

first and second clock signal conditioning means for respective connection to first and second clock signals to condition those signals according to preselected thresholds and for respectively producing first and second conditioned clock signals indicative of the logical values of the first and second clock signals;

qualifier pattern detection means coupled to the collection of conditioned qualifier signals for producing first and second qualifier pattern signals, each qualifier pattern signal being produced in response to the occurrence of a respective and preselected logical combination of the signals within the collection of conditioned qualifier signals;

first and second clock qualification means each respectively coupled to a separate one of the first and second conditioned clock signals and to a separate one of the first and second qualifier pattern signals for respectively producing first and second qualified clock signals, each of which represents the logical conjunction of a conditioned clock signal and an associated qualifier pattern signal;

first and second temporary storage means respectively connected to the first and second collections of conditioned data signals and respectively to the first and second qualified clock signals for respectively storing the values of the signals within the first and second collections of conditioned data signals upon the respective occurrence of the first and second qualified clock signals;

qualified clock selection means coupled to the first and second qualified clock signals for producing a master clock signal at the conclusion of a delay beginning upon the occurrence of a preselected one of the first and second qualified clock signals;

intermediate storage means coupled to receive the contents of the first and second temporary storage means and to the master clock signal for storing the contents of the first and second temporary storage means upon the occurrence of the master clock signal, whereby the first and second temporary storage means are freed to store new data and their combined contents thereafter treated as a single entity;

data memory means coupled to receive the contents of the intermediate storage means and to the master clock signal for storing the contents of the intermediate storage means in response to the occurrence of the master clock signal.

2. Apparatus as in claim 1 wherein each of the first and second clock qualification means produces their respective first and second qualified clock signals in response to the occurrence of the logical conjunction of the leading edge of the respective conditioned clock signal and the presence of an associated qualifier pattern signal.

3. Apparatus as in claim 1 wherein each of the first and second clock qualification means produces their respective first and second qualified clock signals in response to the occurrence of the logical conjunction of the trailing edge of the respective conditioned clock signal and the presence of an associated qualifier pattern signal.

4. Apparatus as in claim 1 wherein each of the first and second clock qualification means produces their respective first and second qualified clock signals in response to the occurrence of the logical conjunction of any edge of the respective conditioned clock signal and the presence of an associated qualifier pattern signal.

5. A method of capturing digital data in a logic state analyzer, comprising the steps of:

storing the values of a first collection of digital signals into first temporary storage means upon the occurrence of a first preselected combination of values among a collection of clock and qualifier signals;

subsequently storing the values of a second collection of digital signals into second temporary storage means upon the subsequent occurrence of a second preselected combination of values among the collection of clock and qualifier signals;

storing the contents of the first and second temporary storage means into intermediate storage means immediately after the subsequent occurrence of the second preselected combination; and then storing the contents of the intermediate storage means into the main data acquisition memory of the logic state analyzer.

* * * * *